(12) United States Patent
Jin et al.

(10) Patent No.: US 10,115,842 B2
(45) Date of Patent: Oct. 30, 2018

(54) SEMICONDUCTOR OPTICAL PACKAGE AND METHOD

(71) Applicants: STMicroelectronics Pte Ltd., Singapore (SG); STMicroelectronics R&D Limited, Marlow (GB)

(72) Inventors: Yonggang Jin, Singapore (SG); David Lawson, South Queensferry (GB); Colin Campbell, Darvel (GB); Anandan Ramasamy, Singapore (SG)

(73) Assignees: STMICROELECTRONICS PTE LTD., Singapore (SG); STMICROELECTRONICS R&D LIMITED, Marlow (GB)

( * ) Notice: Subject to any disclaimer, the term of this patent is extended or adjusted under 35 U.S.C. 154(b) by 0 days.

(21) Appl. No.: 15/802,271

(22) Filed: Nov. 2, 2017

(65) Prior Publication Data

US 2018/0053861 A1    Feb. 22, 2018

Related U.S. Application Data

(63) Continuation of application No. 13/907,280, filed on May 31, 2013, now Pat. No. 9,831,357.

(51) Int. Cl.
| | |
|---|---|
| *H01L 31/0216* | (2014.01) |
| *H01L 31/0232* | (2014.01) |
| *H01L 31/0203* | (2014.01) |
| *H01L 31/02* | (2006.01) |
| *H01L 31/101* | (2006.01) |

(52) U.S. Cl.
CPC .... *H01L 31/02165* (2013.01); *H01L 31/0203* (2013.01); *H01L 31/02005* (2013.01); *H01L 31/02162* (2013.01); *H01L 31/02164* (2013.01); *H01L 31/02327* (2013.01); *H01L 31/1013* (2013.01); *H01L 2224/48091* (2013.01); *H01L 2224/73265* (2013.01)

(58) Field of Classification Search
IPC ............... H01L 31/02327,31/02164, 31/1013, 31/02162, 31/0203, 31/02005, 31/02165, 2224/73265, 2224/48091
See application file for complete search history.

(56) References Cited

U.S. PATENT DOCUMENTS

| | | |
|---|---|---|
| 5,328,854 A | 7/1994 | Vakhshoori et al. |
| 2002/0026956 A1 | 3/2002 | Hanehira et al. |
| 2012/0199826 A1 | 8/2012 | Nakahara et al. |
| 2012/0268574 A1 | 10/2012 | Gidon |

*Primary Examiner* — Hrayr A Sayadian
(74) *Attorney, Agent, or Firm* — Seed Intellectual Property Law Group LLP (57) ABSTRACT

Embodiments of the present disclosure are directed to optical packages having a package body that includes a light protection coating on at least one surface of a transparent material. The light protection coating includes one or more openings to allow light to be transmitted to the optical device within the package body. In one embodiment, the light protection coating and the openings allow substantially perpendicular radiation to be directed to the optical device within the package body. In one exemplary embodiment the light protection coating is located on an outer surface of the transparent material. In another embodiment, the light protection coating is located on an inner surface of the transparent material inside of the package body.

17 Claims, 6 Drawing Sheets

SEMICONDUCTOR OPTICAL PACKAGE AND METHOD

BACKGROUND

Technical Field

Embodiments of the present disclosure are directed to semiconductor packaging for optical devices and methods for making same.

Description of the Related Art

Generally described, optical packages include a package body with one or more optical devices, such as photodiodes, located within the package body. Typically, the package body includes a cover of transparent material, such as glass, for protecting the optical devices. Radiation approaches an outer surface of the glass at various angles of incident and travels through the transparent material to the optical device located within the package body.

Some optical packages may include two optical devices that are located proximate each other, with each of the optical devices being configured to receive light at different frequency ranges than the other. This can creates difficulties as radiation intended for one optical device may be exposed to the other optical device. That is, radiation entering an outer surface of the glass cover at low levels of incident, may be directed to a neighboring optical device in error, thus affecting the accuracy of the measurement. In that regard, the differing light spectrums or frequency ranges may not be suitably isolated from neighboring optical devices.

This problem is associated with optical packages including single optical devices as well, due to radiation entering the glass cover with a low level of incident, which may not go through a filter positioned above the optical device, thereby passing light to the optical device at an undesired frequency.

BRIEF SUMMARY

Embodiments of the present disclosure are directed to optical packages having a package body that includes a light protection coating on at least one surface of a transparent material, such as glass. The light protection coating includes one or more openings to allow light to be transmitted to an optical device within the package body. In one embodiment, the light protection coating and the openings allow substantially perpendicular radiation to be directed to the optical device within the package body. In one exemplary embodiment the light protection coating is located on an outer surface of the transparent material. In another embodiment, the light protection coating is located is located on an inner surface of the transparent material inside of the package body.

In one embodiment, there is provided an optical package comprising a semiconductor substrate having an upper surface. The optical package further includes a first optical device formed in the upper surface of the semiconductor substrate and configured to receive radiation at a first frequency range. The optical package further includes a transparent material having a first surface and an opposite, second surface. The transparent material is located over the first optical device. The transparent material further includes a first light protection coating located on the first surface of the transparent material. The first light protection coating has an opening located over the first optical device and has a thickness that is equal to or greater than a diameter of the first opening. The light protection coating layer is substantially resistant to radiation at the first frequency.

DETAILED DESCRIPTION

Figure 1A:
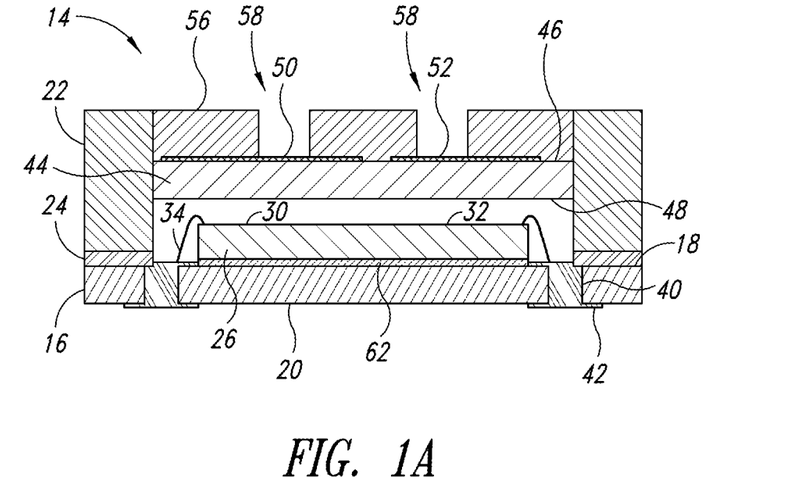
FIG. 1A is a cross-sectional side view of an optical package in accordance with one embodiment.
Figure 1B:
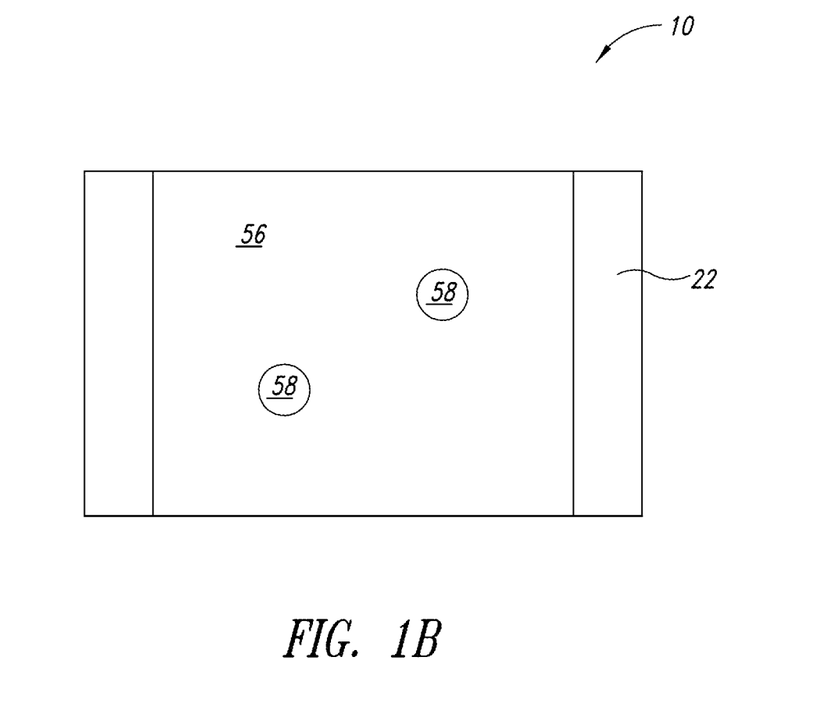
FIG. 1B is a top plan view of the optical package of FIG. 1A.

FIGS. 1A and 1B show an optical package 10 in accordance with one embodiment. FIG. 1A is a cross-sectional side view of the optical package 10, while FIG. 1B is a top plan view of the optical package 10. The optical package 10 has a package body 12 that includes a cover 14, a bottom substrate 16 having inner surface 18 and outer surface 20, and sidewalls 22.

The sidewalls 22 are secured to the inner surface 18 of the bottom substrate 16 by an adhesive material 24. The sidewalls 22 may be any material configured to protect the inner portion of the optical package 10. In one embodiment, the sidewalls 22 are a metal material, such as aluminum or a tin-zinc compound. As will be discussed below, the bottom substrate 16 may include one or more conductive, semiconductor, and/or insulative layers.

Inside the package body 12 is a semiconductor substrate 26, such as silicon, that is attached to the inner surface 18 of the bottom substrate 16 by an adhesive material 62. A first optical device 30 is formed in a first portion of the substrate 26 and a second optical device 32 is formed in a second portion of the substrate 26. The first and second optical devices 30, 32 are configured to receive radiation and to generate an electrical signal in response to the received radiation. In some embodiments, the optical devices are photodiodes.

The electrical signals generated by the first and second optical devices 30, 32 may be provided to an integrated circuit (not shown) formed in the bottom substrate 16. In that regard, conductive paths are provided between the first and second optical devices 30, 32 and the integrated circuit. In the illustrated embodiment, the conductive paths include conductive wires 34 that are coupled at one end to one or more bond pads of the first optical device and/or the second optical device and at another end to the bond pads of the inner surface of the bottom substrate 16 of the package body 12. Conductive traces or conductive through-vias 40 may provide electrical connection between the contact pad on the inner surface of the bottom substrate 16 and the integrated circuit. Lands 42 on the outer surface 20 of the bottom substrate 16 provide electrical connection outside of the package body 12. It is to be appreciated that in other embodiments, the integrated circuit may be located inside the package body 12 on the inner surface 18 of the bottom substrate 16 or externally connected to the outside of the package 10.

The first optical device 30 and the second optical device 32 receive radiation at different frequency ranges. For instance, the first optical device 30 may be configured to receive radiation in the visible light frequency range, such as a photodiode comprising an ambient light sensory (ALS) array, and the second optical device 32 may be configured to receive radiation in the infrared frequency range, such as a photodiode comprising an RTN single-photon avalanche diode (SPAD) array.

Although the first and second optical devices 30, 32 are shown as being formed in the same substrate, it is to be appreciated that the first optical device 30 may be formed in a substrate that is distinct from the second optical device 32. Furthermore, in an alternative embodiment, the substrate that forms the bottom substrate 16 of the package includes the first and second optical devices 30, 32 and the sidewalls 22 are secured directly to the upper surface of substrate 26.

Located above the first and second optical devices 30, 32 of the substrate 26 is the cover 14. The cover 14 includes a transparent material 44 that is configured to protect the first and second optical devices 30, 32. In one embodiment, the transparent material 44 is a glass material. The transparent material 44 includes a first surface 46 facing outwardly of the package and an opposite, second surface 48 facing the first and second optical devices 30, 32. In the illustrated embodiment, the second surface 48 of the transparent material 44 is located a distance from the upper surface of the substrate 26, thus creating a cavity in which the conductive wires 34 are located. However, it is to be appreciated that second surface 48 of the transparent material 44 may be secured to the upper surface of the substrate 26 by an adhesive, or it may directly rest on top of the upper surface of the substrate 26. In such an embodiment, the first and second optical devices 30, 32 may be coupled to the integrated circuit in the bottom substrate 16 by through-vias through the substrate 26.

A first light filter 50 is located on the first surface 46 of the transparent material 44 over the first portion of the substrate 26 such that the first light filter 50 is located over the first optical device 30. A second light filter 52 is located on the first surface 46 of the transparent material 44 over the second portion of the substrate 26 such that the second light filter 52 is located over the second optical device 32. The first and second light filters 50, 52, respectively, are configured to pass light that corresponds to the type of the light each of the respective first and second optical devices 30, 32 is configured to receive. For instance, in an embodiment in which the first optical device 30 includes an ambient light sensor (ALS) array, the first light filter 50 may be configured to pass visible light. In an embodiment in which the second optical device 32 is a single-photon avalanche diode (SPAD), the second light filter 52 may be configured to pass infrared light.

A light protection coating 56 is located on at least one of the first and second surfaces 46, 48 of the transparent material 44. In the illustrated embodiment, the light protection coating 56 is located on the first surface 46 of the transparent material 44. Generally described, the light protection coating 56 is made from a light absorbent material. In that regard, the light protection coating 56 absorbs a significant portion of the light directed toward. In addition, the light protection coating may be configured to reflect light directed toward it. In one embodiment, the light protection coating 56 is configured to absorb and/or reflect over 90% of the IR radiation directed toward its surface. Furthermore, the light protection coating 56 is configured to minimize radiation refracting in the transparent material 44. In some embodiments, the light protection coating 56 is a dry film, such as photoresist or an organic polymer.

The light protection coating 56 has openings 58 above the first and second optical devices 30, 32 to allow light to be received through the corresponding filters and be directed to the optical devices 30, 32. Although the openings 58 in the illustrated embodiment are a circle having a diameter as best shown in FIG. 1B, the openings 58 may be any known shape and the term diameter may thus refer to a width or a diagonal width of the shape of the opening 58. For example, the shape of the opening 58 may be a square and the diameter may thus refer to a sidewall of the square or the diagonal dimension of the square.

Figure 2:
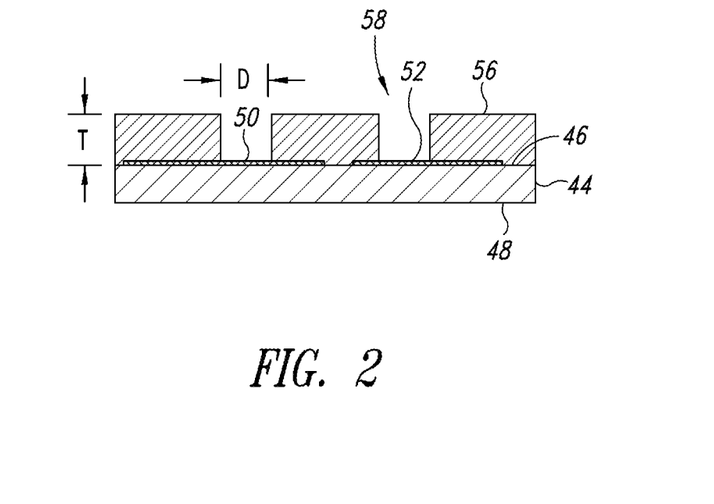
FIG. 2 is a side view of a transparent material with a light protection coating in accordance with the embodiment of FIG. 1.

FIG. 2 shows a side view of the transparent material 44 with the light protection coating 56 without the other portions of the optical package 10. As shown in FIG. 2, the light protection coating 56 has a thickness that is substantially equal to the diameter of the openings 58. In one embodiment, the thickness of the light protection coating 56 and the diameter of the openings 58 is between about 300 to 400 microns. It is to be appreciated that in other embodiments, the thickness of the light protection coating 56 may be greater than the diameter of the openings 58. In yet another embodiment, the thickness of the light protection coating 56 is less than the diameter of the openings 58.

Figure 3:
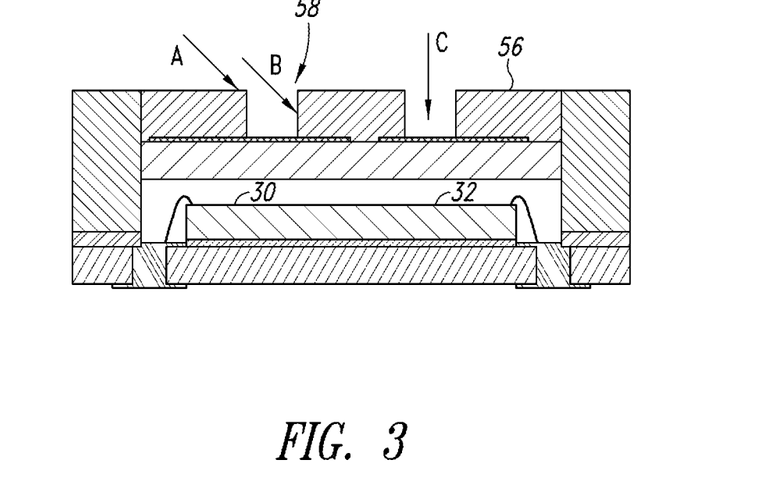
FIG. 3 is a cross-sectional side view of the optical package of FIG. 1 illustrating exemplary radiation being directed toward the optical package.

FIG. 3 illustrates exemplary radiation rays being directed toward the optical package 10. Ray A is directed at an angle toward package at a low level of incident and is absorbed by the light protection coating 56. Although not shown, ray A may also be reflected, at least in part, by the light protection coating 56. Similarly, if radiation enters the opening 58 having a low level of incident, the radiation may be directed into the sidewalls of the light protection coating 56 at the opening, thereby absorbing and/or reflecting light away from the optical devices 30, 32 located below. For instance, ray B enters the opening 58 with a low level of incident and is absorbed by the light protection coating 56, thus preventing ray B from being directed to the second optical device 32. The light protection coating 56 and the openings 58 allow radiation having a high level of incident to be provided to the optical devices 30, 32. For instance, ray C is directed toward one of the openings 58 in the light protection coating 56 and at least a portion of ray C goes through the second light filter 52 and is provided to the second optical device 32.

Figure 4A:
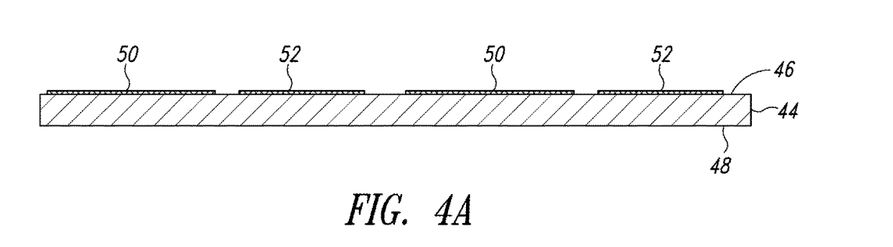
FIGS. 4A-4G illustrate a method of making the optical package in FIG. 1 in accordance with one embodiment.

FIGS. 4A-4G illustrate various stages of making the optical package 10 in accordance with one embodiment. As shown in FIG. 4a, first and second filters 50, 52 are placed on the first surface 46 of the transparent material 44 in a spaced-apart relationship. The size of the first and second filters 50, 52 may correspond to the radiation receiving portion of the first and second optical devices 30, 32 or may be larger than the radiation receiving portion of the first and second optical devices 30, 32.

Figure 4B:
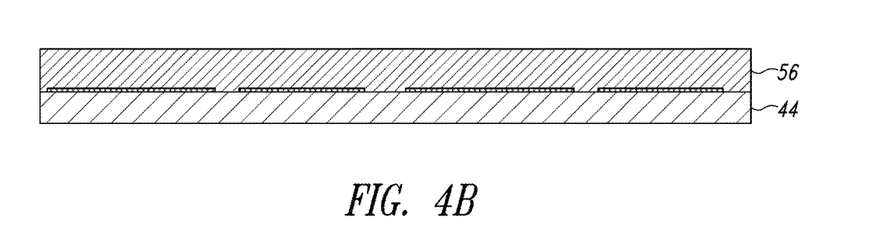

The light protection coating 56 is deposited on the first and second surfaces 46, 48 of the transparent material 44 as shown in FIG. 4b. In one embodiment the light protection coating 56 is photoresist, and the photoresist is deposited on the transparent material using known deposition techniques.

Figure 4C:
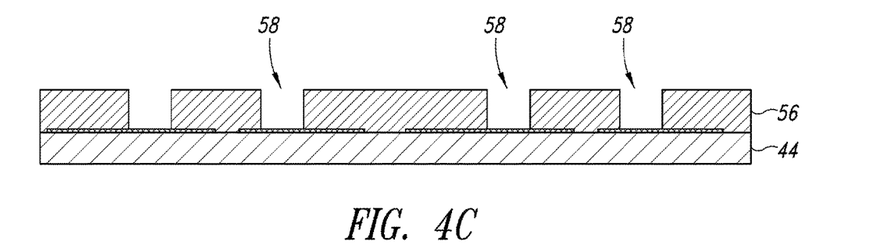
Figure 4D:
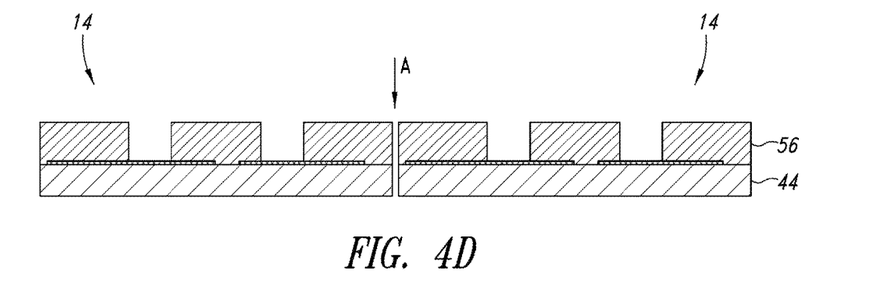

As shown in FIG. 4C, openings 58 are formed in the light protection coating 56, such as by etching or exposure, developer, and curing techniques. It is to be appreciated, however, that the light protection coatings 56 may be deposited on portions of the first surface 46 such that openings 58 are formed during the deposition process itself. As shown in FIG. 4D, the structures are then singulated at the location of arrow A into separate structures, such as by sawing or laser techniques, to form the cover 14.

Figure 4E:
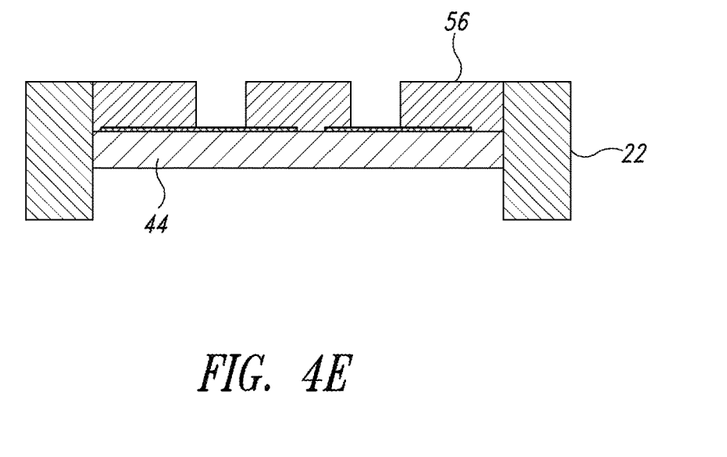

As shown in FIG. 4E, the transparent material 44 is then coupled at its side surfaces to the sidewalls 22 of the package body 12. In one embodiment, the sidewalls 22 may be secured to the side surfaces of the transparent material 44 via an adhesive material (not shown). In another embodiment, the sidewalls 22 may be secured to the transparent material 44 during an injection molding process. That is, the covers 14 are placed into the mold and the sidewall material is injected into the mold. The injected sidewall material hardens against the transparent material 44 and the light protection coating 56.

Figure 4F:
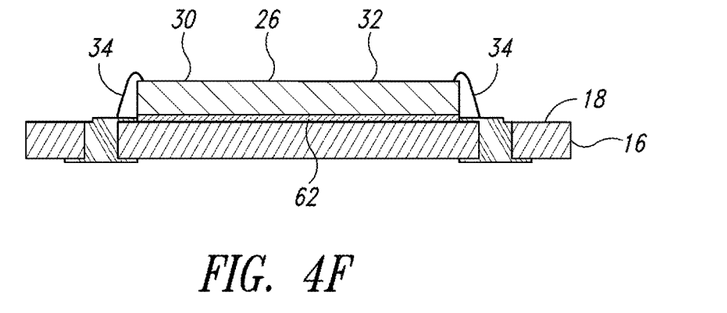

As shown in FIG. 4F, the substrate 26 is secured to the bottom substrate 16 via an adhesive material 62. The adhesive material 62 may be a thermally conductive paste or an insulative paste. One or more conductive wires 34 are coupled at one end to the bond pads of one of the first and second optical devices 30, 32 and at another end to the pads of the bottom substrate 16.

Figure 4G:
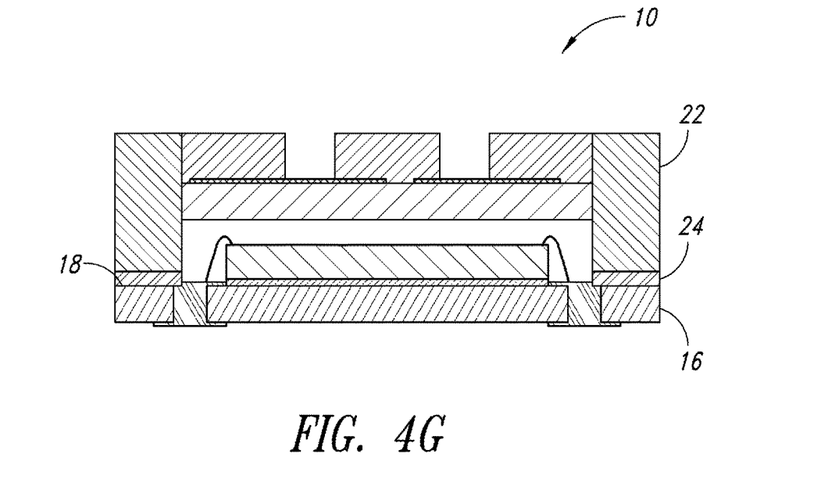

As shown in FIG. 4G, the sidewalls 22 are secured to the inner surface 18 of the bottom substrate 16 via the adhesive material 24, thereby forming the optical package 10. The adhesive material 24 may be a thermally conductive paste or an insulative adhesive material.

Figure 5:
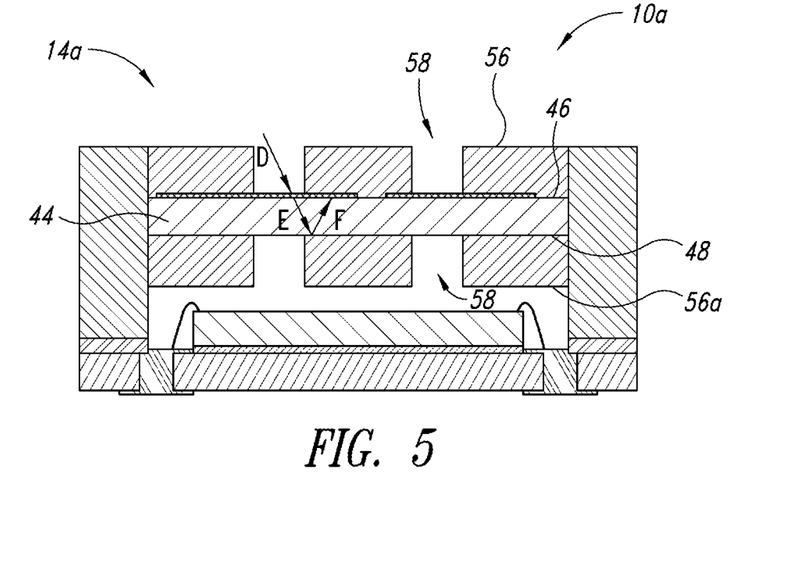
FIG. 5 is a cross-sectional side view of another optical package in accordance with one embodiment.

FIG. 5 shows a cross-sectional view of an optical package 10a in accordance with a second embodiment. The optical package 10a is identical to the optical package 10 of FIG. 1 except the optical package 10a of FIG. 5 has a cover 14a that includes a second light protection coating 56a on the second surface 48 of the transparent material 44. As shown in FIG. 5, radiation ray D is directed toward the opening 58 of the light protection coating 56 on the first surface 46 of the transparent material 44 at an obtuse angle. Ray E enters the transparent material 44 and is reflected, at least in part, by the second light protection coating 56a on the second surface 48 of the transparent material 44 as shown by ray F. Furthermore, some of the ray E may be absorbed by the second light protection coating 56a.

Furthermore, at least a portion of the radiation directed to the light protection coating 56 may be allowed through the light protection coating 56 on the first surface 46 of the transparent material 44, such as an amount less than 10%. The second light protection coating 56a on the second surface 48 of the transparent material 44 would be able to reflect and/or absorb this radiation. As such the reflected radiation may travel through the transparent material 44 and may be directed to the light protection coating 56 on the first surface 46, which also may reflect and/or absorb the radiation. In that regard, the radiation may suitably dissipate before reaching the opening 58 in the second light protection coating 56a above the second optical device 32.

The first and second light protection coatings 56, 56A of the package 10a further cause the radiation directed to the first and second optical devices 30, 32 to be even more vertical than the package 10 of FIG. 1.

Figure 6A:
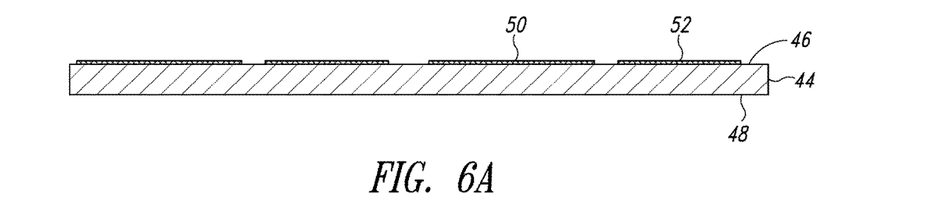
FIGS. 6A-6D illustrate a portion of the method of making the optical package of FIG. 5 in accordance with one embodiment.
Figure 6B:
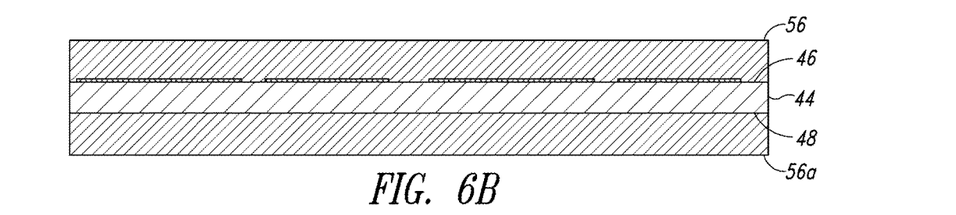
Figure 6C:
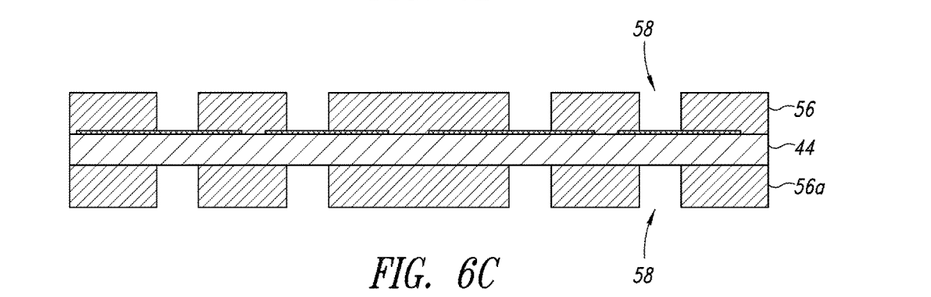
Figure 6D:
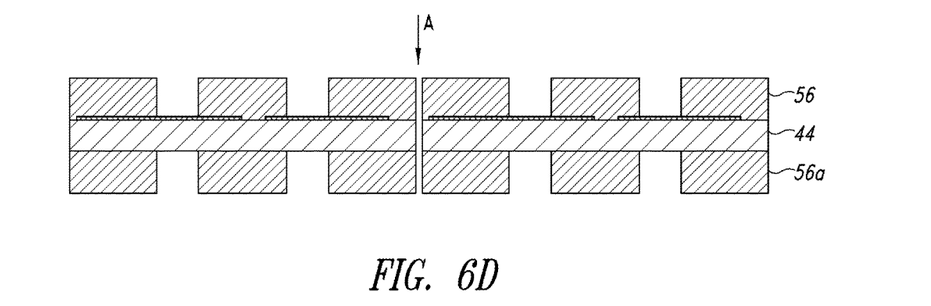

FIGS. 6A-6D illustrate a method of making the cover 14a for the optical package 10a of FIG. 5. The method of FIGS. 6A-6D are the same as the method of FIGS. 4A-4D except that a second light protection coating 56a is also deposited onto the second surface 48 of the transparent material 44. As shown in FIG. 6c, openings 58 are formed in the light protection coatings 56, 56A on both first and second surfaces 46, 48 of the transparent material 44. Although not shown, it is to be appreciated that in another embodiment the light protection coating 56a may be located on the second surface 48 of the transparent material 44 and not located on the first surface 46 of the transparent material 44.

The optical packages can be used in a variety of optical devices, such as cameras, smart phones, or any other optical device.

It is to be appreciated that the term light and radiation have been used interchangeably herein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first substrate;
a second semiconductor substrate having a first surface on the first substrate and a second surface opposite the first surface, the semiconductor substrate including a first optical device and a second optical device that receive light from the second surface;
a first sidewall on the first substrate;
a second sidewall on the first substrate, the second semiconductor substrate being between the first and second sidewall;
a transparent layer extending between the first and second sidewall and overlapping the second surface of the semiconductor substrate;
a first light protection coating on the transparent layer, the transparent layer being between the first light protection coating and the second surface of the semiconductor substrate;
a first opening in the first light protection coating; and
a second opening in the first light protection coating.

2. The device of claim 1, further comprising a second light protection coating on the transparent layer, the transparent layer being between the first light protection coating and the second light protection coating.

3. The device of claim 2, further comprising:
a third opening in the second light protection coating; and
a fourth opening in the second light protection coating.

4. The device of claim 3 wherein the first opening is aligned with the third opening and the second opening is aligned with the fourth opening.

5. The device of claim 1, further comprising a first optical filter on the transparent layer and aligned with the first opening.

6. The device of claim 5, further comprising a second optical filter on the transparent layer and aligned with the second opening.

7. A device, comprising:
a first substrate;

a second semiconductor substrate having a first surface on the first substrate and a second surface opposite the first surface, the semiconductor substrate including a first optical device that receives light from the second surface;

a first sidewall on the first substrate;

a second sidewall on the first substrate, the second semiconductor substrate being between the first and second sidewall;

a transparent layer extending between the first and second sidewall and overlapping the second surface of the semiconductor substrate;

a first light protection coating on the transparent layer, the transparent layer being between the first light protection coating and the second surface of the semiconductor substrate; and a first opening in the first light protection coating.

8. The device of claim 7, further comprising a first optical filter on the transparent layer and aligned with the first opening.

9. The device of claim 7, further comprising a second light protection coating on the transparent layer, the transparent layer being between the first light protection coating and the second light protection coating.

10. The device of claim 9, further comprising a second opening in the second light protection coating.

11. The device of claim 7, further comprising a second optical device in the second semiconductor substrate.

12. The device of claim 11 wherein the first light protection coating includes a second opening aligned with the second optical device.

13. A device, comprising:
a semiconductor substrate having a first surface and an opposite second surface;
a first optical device in the semiconductor substrate between the first and second surfaces;
a second optical device in the semiconductor substrate between the first and second surfaces;
a transparent material having a first surface and an opposite second surface, the first surface of the semiconductor substrate being between the second surface of the transparent material and the second surface of the semiconductor substrate;
a first optical filter on the first surface of the transparent material and a second optical filter on the first surface of the transparent material;
a first nontransparent light protection coating on the first surface of the transparent material;
a first opening in the first nontransparent light protection coating aligned with and overlapping the first optical device; and
a second opening aligned in the first nontransparent light protection coating with and overlapping the second optical device, the first optical filter being between the transparent material and the first light protection coating.

14. The device of claim 13 wherein a first portion of the transparent material is aligned with and overlapping the first optical device and a second portion of the transparent material being is with and overlapping the second optical device.

15. The device of claim 14, further comprising a support substrate, the semiconductor on the support substrate.

16. The device of claim 15, further comprising sidewalls extending away from the support substrate, the transparent material coupled to the sidewalls.

17. The device of claim 13, further comprising a second nontransparent light protection coating on the second surface of the transparent material.

\* \* \* \* \*

UNITED STATES PATENT AND TRADEMARK OFFICE
CERTIFICATE OF CORRECTION

PATENT NO. : 10,115,842 B2
APPLICATION NO. : 15/802271
DATED : October 30, 2018
INVENTOR(S) : Yonggang Jin et al.

Page 1 of 1

It is certified that error appears in the above-identified patent and that said Letters Patent is hereby corrected as shown below:

On the Title Page

Item (73) Assignees:
"STMICROELECTRONICS PTE LTD., Singapore (SG); STMICROELECTRONICS R&D LIMITED, Marlow (GB)"
Should read:
--STMICROELECTRONICS PTE LTD., Singapore (SG); STMICROELECTRONICS (RESEARCH & DEVELOPMENT) LIMITED, Marlow (GB)--.

Signed and Sealed this
Third Day of March, 2020

Andrei Iancu
*Director of the United States Patent and Trademark Office*